United States Patent
Kang

(10) Patent No.: US 6,967,897 B2
(45) Date of Patent: Nov. 22, 2005

(54) FERAM HAVING WIDE PAGE BUFFERING FUNCTION

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,009

(22) Filed: Jun. 30, 2004

(65) Prior Publication Data
US 2005/0122761 A1   Jun. 9, 2005

(30) Foreign Application Priority Data
Dec. 4, 2003  (KR) .................. 10-2003-0087528

(51) Int. Cl.⁷ .............................................. G11C 8/00
(52) U.S. Cl. .............. 365/238.5; 365/145; 365/230.06; 365/236
(58) Field of Search ............................. 365/238.5, 236, 365/145, 230.06, 63

(56) References Cited

U.S. PATENT DOCUMENTS

| | | | |
|---|---|---|---|
| 5,841,721 A * | 11/1998 | Kwon et al. ................. | 365/218 |
| 6,097,666 A * | 8/2000 | Sakui et al. ............ | 365/230.06 |
| 6,272,594 B1 | 8/2001 | Gupta et al. | |
| 6,341,081 B2 * | 1/2002 | Kang .......................... | 365/145 |
| 6,363,439 B1 | 3/2002 | Battles et al. | |
| 6,771,531 B2 * | 8/2004 | Nishihara ................... | 365/145 |
| 6,903,981 B2 * | 6/2005 | Futatsuyama et al. . | 365/185.33 |

FOREIGN PATENT DOCUMENTS

KR   1998-14400   7/2000

* cited by examiner

Primary Examiner—Son T. Dinh
(74) Attorney, Agent, or Firm—Heller Ehrman LLP

(57) ABSTRACT

A nonvolatile ferroelectric memory device features a wide page buffering function. The nonvolatile ferroelectric memory device comprises a single cell array block, a word line driving unit, a plate line driving unit, a wide page buffer unit and a column selecting unit. All cell arrays in the memory device are included in a single cell array block. In a read mode, the wide page buffer unit simultaneously senses and buffers voltages of all main bit lines in the single cell array block and outputs the buffered data to a data buffer unit by a predetermined data width unit. In a write mode, the wide page buffer unit receives write data in a predetermined data width, buffers the write data until the write data corresponding to the all main bit lines are applied, and simultaneously writes the buffered data in the cells. As a result, the cell efficiency is increased, and the data processing speed is improved.

15 Claims, 10 Drawing Sheets

FERAM HAVING WIDE PAGE BUFFERING FUNCTION

BACKGROUND OF THE INVENTION

1. Field of the Invention

The present invention generally relates to a nonvolatile ferroelectric memory device having a hierarchical bit line architecture, and more specifically, to a nonvolatile ferroelectric memory device comprising a single large page cell array block including the whole unit cells and a high capacity wide page buffer corresponding to all main bit lines in the page cell array block, thereby improving the efficiency of the memory cell and the data processing speed.

2. Description of the Prior Art

Generally, a ferroelectric random access memory (hereinafter, referred to as 'FeRAM') has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 1998-14400 by the same inventor of the present invention. Therefore, the basic structure and the operation on the FeRAM are not described herein.

FIG. 1 is a diagram illustrating a conventional nonvolatile ferroelectric memory device.

The nonvolatile ferroelectric memory device of FIG. 1 comprises a plurality of cell array blocks 10 comprising a plurality of cell arrays, a common data bus 20 shared in the plurality of cell array blocks 10 and for transmitting data, and a sense amplifier unit 30 for sensing and buffering data applied through the common data bus 20. Here, a word line driving unit W/L and a plate line driving unit P/L are included in each cell array block 10. Each cell array block 10 is selectively connected to the common data bus 20 in response to a column selecting signal, and reads or writes data.

In the nonvolatile ferroelectric memory device of FIG. 1, since the column selecting signal is selectively activated in each cell array block 10, only data of the corresponding cell array block 10 are applied to the common data bus 20.

In the above-described nonvolatile ferroelectric memory device of FIG. 1, since the word line driving unit W/L and the plate line driving unit P/L are included in each cell array block 10, these driving units occupy a large area in the memory device. In addition, since it is necessary to access the cell array block 10 in every read or write operation, the processing of a great deal of data requires much access time. Furthermore, attention has been more directed to the problem of the access time as memory capacity becomes larger.

SUMMARY OF THE INVENTION

Accordingly, it is an object of the present invention to increase efficiency of cells and rapidly process data of high capacity by improving structures of a cell array block and a data buffer.

In an embodiment, a nonvolatile ferroelectric memory device having a wide page buffering function comprises a single cell array block, a word line driving unit, a plate line driving unit, a wide page buffer unit and a column selecting unit. The single cell array block including cell arrays having a hierarchical bit line architecture induces a sensing voltage to a main bit line by regulating the amount of current leaked from the main bit line depending on a sensing voltage of cell data transmitted to a sub bit line. Additionally, the whole cell arrays for storing cell data are included in one unit page block. The word line driving unit located at a first side of the single cell array block selectively activates a word line of the single cell array block. The plate line driving unit located at a second side of the single cell array block selectively activates a plate line of the single cell array block. The wide page buffer unit simultaneously senses voltages of all main bit lines in the single cell array block and buffers sensed data. The wide page buffer unit transmits the buffered data to a data buffer unit by a predetermined data width unit in response to a column selecting signal. The column selecting unit selectively activates the column selecting signal in response to a column address.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 2:
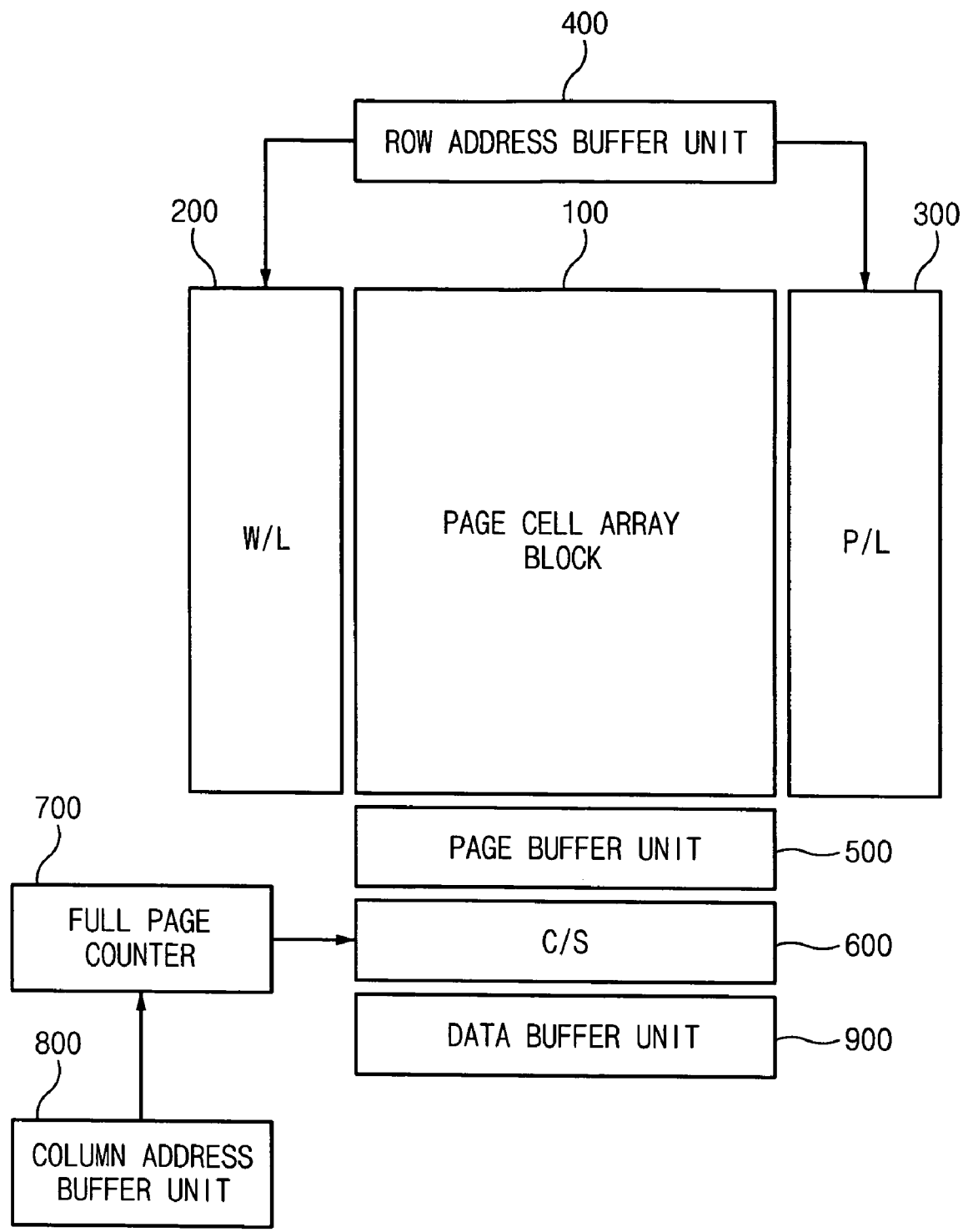
FIG. 2 is a diagram illustrating a nonvolatile ferroelectric memory device according to an embodiment of the present invention.

FIG. 2 is a diagram illustrating a nonvolatile ferroelectric memory device according to an embodiment of the present invention.

In an embodiment, the nonvolatile ferroelectric memory device comprises a single cell array block 100, a word line driving unit 200, a plate line driving unit 300, a row address buffer unit 400, a wide page buffer unit 500, a column selecting unit 600, a full page counter 700 and a column address buffer unit 800.

The single cell array block 100 represents a large-scaled cell array block where all cell arrays in the memory device is included in one cell array block. The single cell array block 100 has a hierarchical bit line architecture having a plurality of sub bit lines and main bit lines. In the hierarchical bit line architecture, a plurality of sub bit lines are selectively connected to one main bit line, and sensing voltage of the main bit line is induced depending on a sensing voltage of the sub bit line if cell data are applied to the sub bit line.

The word line driving unit 200 and the plate line driving unit 300 selectively activate word lines and plate lines in the single cell array block 100 in response to a row address applied from the row address buffer unit 400. Since the whole cells of the memory device are included in one unit block 100 in an embodiment of the present invention, only one word line driving unit 200 is located at one side of the single cell array block 100 and only one plate line driving unit 300 is located at the other side of the single cell array block 100. As a result, the area occupied by the word line driving unit 200 and the plate line driving unit 300 is minimized, thereby increasing the efficiency of cells.

In this way, since the memory device according to an embodiment of the present invention comprises one single cell array block 100, one word line driving unit 200 and one plate line driving unit 300, the sensing voltage is induced to all main bit lines simultaneously by one activation of the word line and the plate line. For example, if the number of main bit lines in the memory device is n, data of n bits are read or written at one time.

The row address buffer unit 400 temporarily stores row addresses for driving the word line driving unit 200 and the plate line driving unit 300.

The wide page buffer unit 500 senses data corresponding to all main bit lines included in the single cell array block 100 and buffers the sensed data. In a read mode, the wide page buffer unit 500 senses sensing voltages of all main bit lines simultaneously, buffers sensed data, and outputs the buffered data in a predetermined data width (which represents the number of data inputted or outputted simultaneously by one column selection) in response to a column selecting signal. In a write mode, the wide page buffer unit 500 buffers write data applied in a predetermined data width in response to the column selecting signal, and outputs the buffered data to all main bit lines at one time. A wide page represents the amount of data having the number of bits corresponding to that of all main bit lines included in the memory device. Since all cell arrays are included in one single block according to an embodiment of the present invention, data having the number of bits corresponding to that of all main bit lines are simultaneously sensed by once activation of the word line and the plate line.

In the wide page buffer unit 500, a plurality of sense amplifier arrays are arranged in parallel, and each sense amplifier array is connected to the main bit lines.

The column selecting unit 600 selectively activates column selecting signals in response to an output signal from the full page counter unit 700. The read data buffered in the wide page buffer unit 500 are transmitted in a predetermined data width to the data buffer unit 900 in response to the column selecting signal. The write data applied from the data buffer unit 900 are buffered in a predetermined data width in the wide page buffer unit 500 in response to the column selecting signal.

The full page counter 700 counts the column addresses, and controls generation of the column selecting signals of the column selecting unit 600 to regulate the size of data widths.

The column address buffer unit 800 temporarily stores column addresses for driving the column selecting unit 600.

Figure 3:
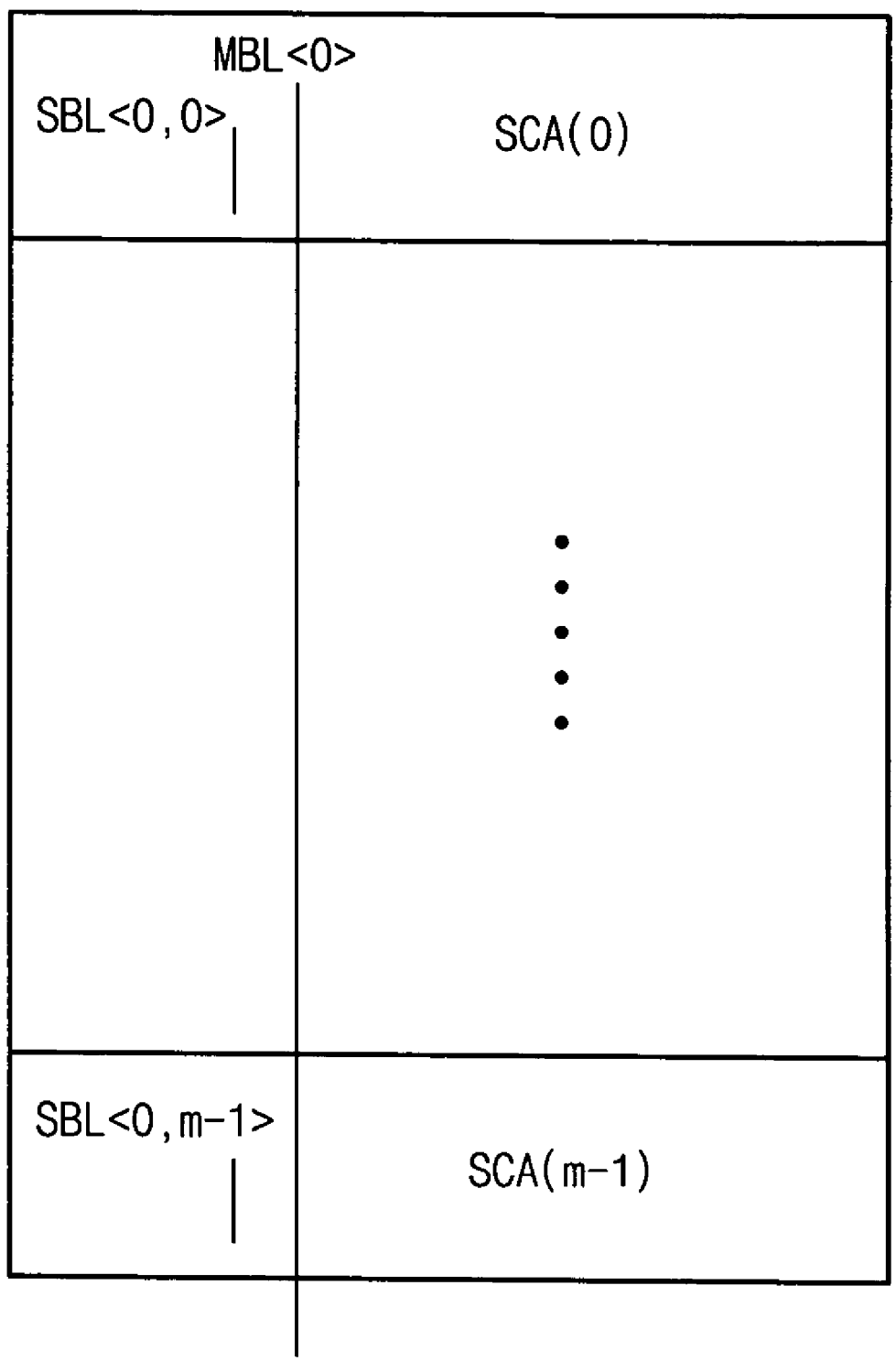
FIG. 3 is a diagram illustrating a single cell array block 100 according to an embodiment of the present invention.

FIG. 3 is a diagram illustrating the single cell array block 100 according to an embodiment of the present invention.

In an embodiment, the single cell array block 100 comprises a plurality of sub cell arrays SCA(0)~SCA(m−1) arranged in parallel. The main bit line MBL<0> is shared by the sub cell arrays SCA(0)~SCA(m−1), and connected to the wide page buffer unit 500. Each sub bit line SBL<0, 0>~SBL<0,m−1> is included in each sub cell array SCA(0) ~SCA(n), and shares the main bit line MBL<0>. A plurality of unit cells (not shown) are connected to each sub bit line SBL<0,0>~SBL<0,m−1>. One unit cell is selectively connected to each sub bit line SBL<0,0>~SBL<0,m−1>, and the sensing voltage of the main bit line MBL<0> is induced by voltage of one sub bit line connected to the selected cell.

Although FIG. 3 shows one main bit line and the plurality of sub bit lines SBL<0,0>~SBL<0,m−1> corresponding to the main bit line MBL<0>, the single cell array block 100 includes a plurality of main bit lines and sub bit lines arranged in parallel as shown in FIG. 3 depending on data capacity.

Figure 4:
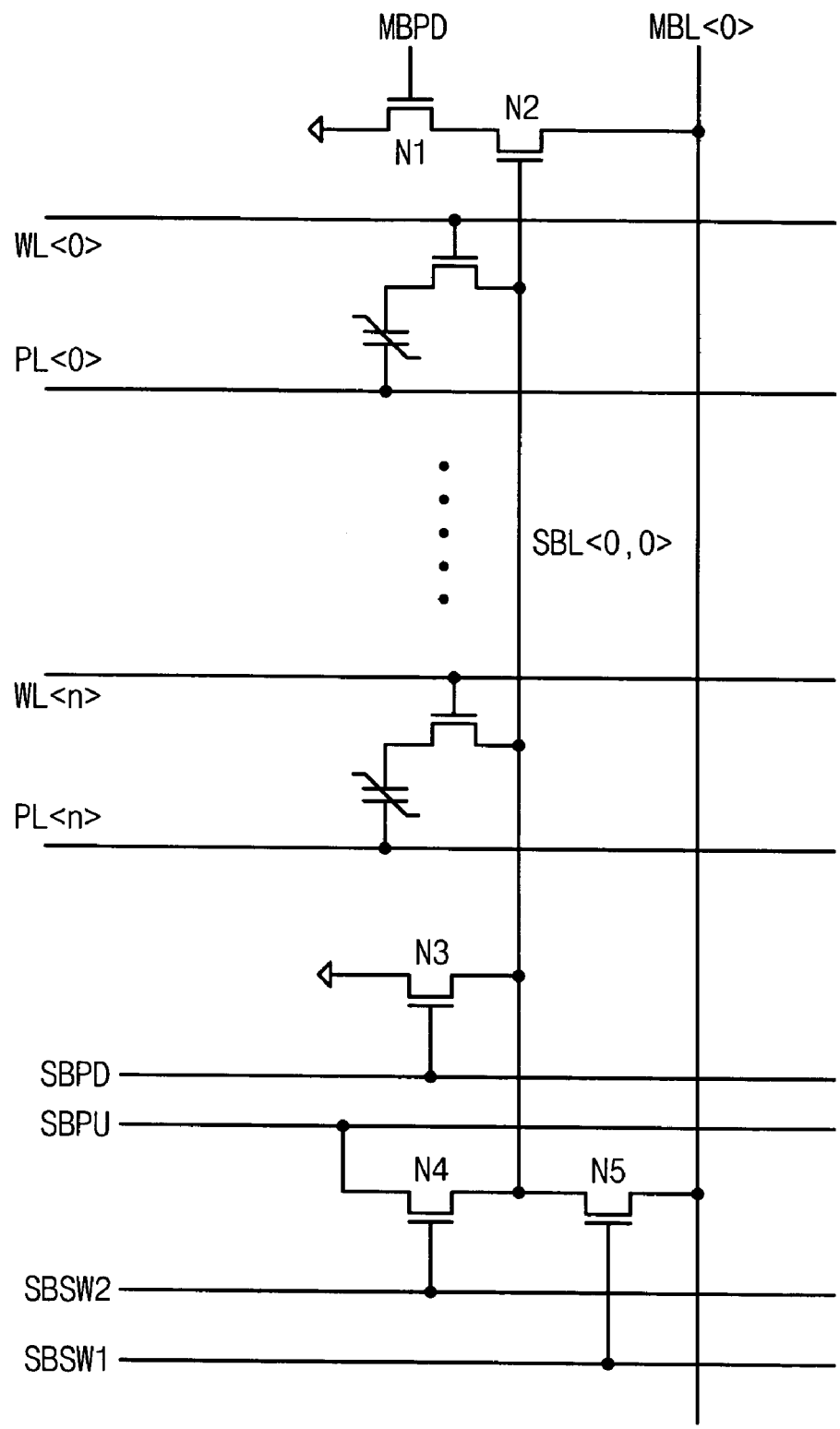
FIG. 4 is a circuit diagram illustrating a unit sub cell array in a sub cell array SCA(0) of FIG. 3.

FIG. 4 is a circuit diagram illustrating one unit sub cell array in the sub cell array SCA(0) of FIG. 3. FIG. 4 shows the connection relationship of the main bit line MBL<0>, the sub bit line SBL<0,0> and the corresponding cell arrays.

If a sub bit line selecting signal SBSW1 is activated, a NMOS transistor N5 is turned on. As a result, load of the main bit line MBL<0> is adjusted to a level of one sub bit line SBL. If a sub bit line pull-down signal SBPD is activated to turn on a NMOS transistor N3, the sub bit line SBL<0,0> is adjusted to a ground voltage level.

The sub bit line pull-up signal SBPU regulates power to be supplied to the sub bit line SBL<0,0>. A sub bit line selecting signal SBSW2 regulates signal flow between the sub bit line pull-up signal SBPU and the sub bit line SBL<0,0>.

To generate a high voltage in the sub bit line SBL<0,0>, a voltage higher than the power voltage VCC is to be supplied as the sub bit line pull-up signal SBPU. Next, if the sub bit line selecting signal SBSW2 is activated to turn on a NMOS transistor N4, the high voltage is supplied to the sub bit line SBL<0,0>.

A NMOS transistor N1, connected between a ground voltage and a NMOS transistor N2, has a gate to receive a main bit line pull-down signal MBPD. The NMOS transistor N2, connected between the NMOS transistor N1 and the main bit line MBL<0>, has a gate connected to the sub bit line SBL<0,0>. When the main bit line pull-down signal MBPD is activated, the NMOS transistor N2 regulates the amount of current leaked from the main bit line MBL<0> to the ground power depending on the sensing voltage of the sub bit line SBL<0,0>. The level of the sensing voltage induced to the main bit line MBL<0> is determined depending on the amount of current leaked by the NMOS transistor N2.

For example, if a data value of the selected cell is 'high', the sensing voltage of a high level is transmitted to the sub bit line SBL<0,0>. As a result, the amount of current flowing through the NMOS transistor N2 becomes larger, thereby lowering the voltage level of the main bit line MBL<0> with a great width. On the other hand, if data of the selected cell is 'low', the sensing voltage of a low level is transmitted to the sub bit line SBL<0,0>. As a result, the amount of current flowing through the NMOS transistor N2 becomes smaller, thereby lowering the voltage level of the main bit line MBL<0> with a little width. In this way, a level difference of the sensing voltage of the main bit line MBL<0> is generated depending on cell data, and data of the selected cell can be sensed by using the level difference.

Figure 5:
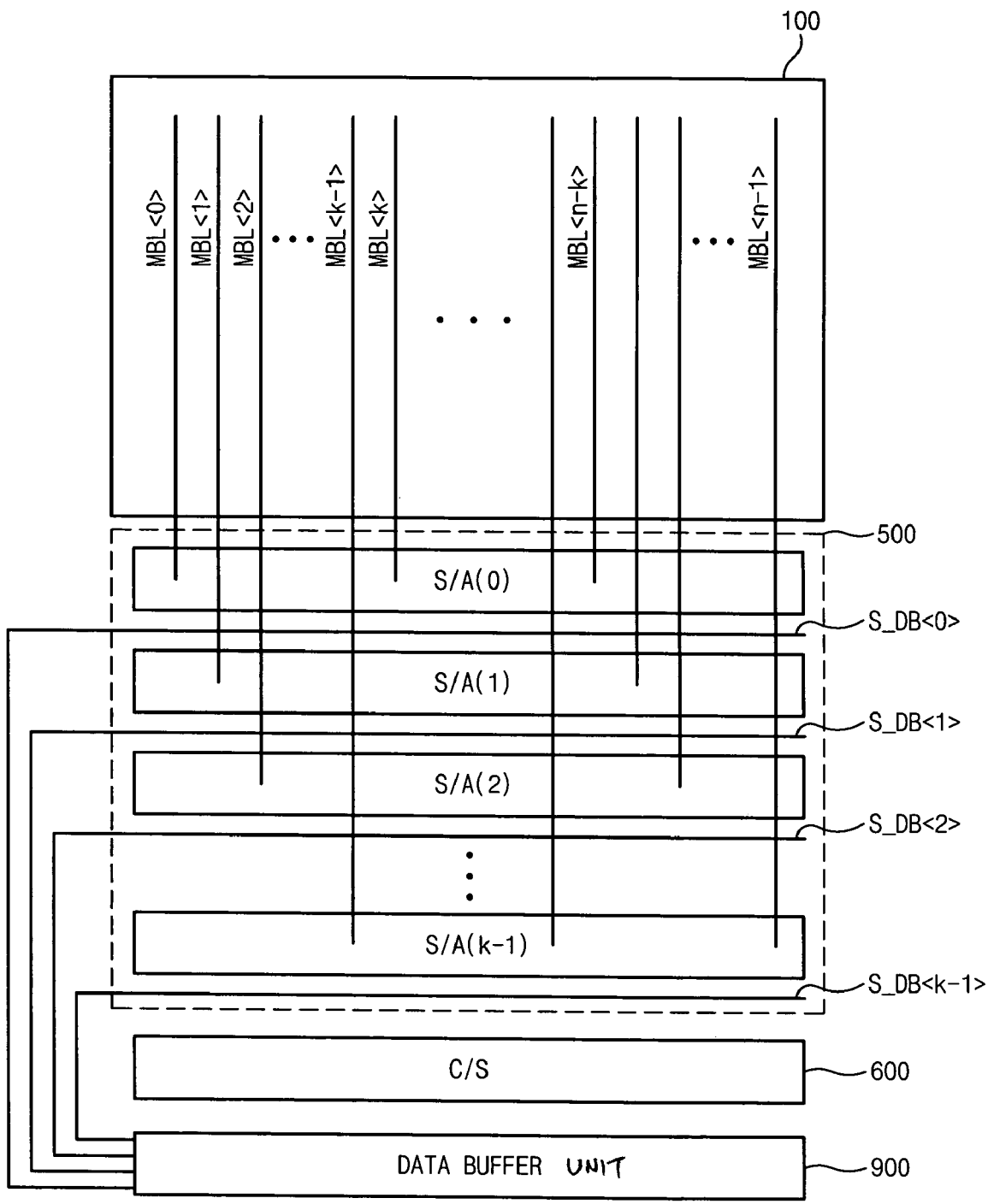
FIG. 5 is a diagram illustrating a wide page buffer unit and the connection relationship of the wide page buffer unit and main bit lines.

FIG. 5 is a diagram illustrating the wide page buffer unit 500 and the connection relationship of the wide page buffer unit 500 and the main bit lines MBL<0>~MBL<n-1>.

The wide page buffer unit 500 comprises a plurality of sense amplifier arrays S/A(0)~S/A(k-1) arranged in parallel. The main bit lines MBL<0>~MBL<n-1> are sequentially and repeatedly connected to the sense amplifier arrays S/A(0)~S/A(k-1) as shown in FIG. 5. In other words, the main bit lines MBL<0>, MBL<k>, . . . , MBL<n-k> are connected to the sense amplifier array S/A(0), the main bit lines MBL<1>, MBL<k+1>, . . . , MBL<n-K+1> are connected to the sense amplifier array S/A(1), and the main bit lines MBL<k-1>, MBL<2k-1>, . . . , MBL<n-1> are connected to the sense amplifier array S/A(k-1).

In this way, the sense amplifier arrays S/A(0)~S/A(k-1) are arranged in parallel in a predetermined number because sense amplifiers corresponding one by one to main bit lines may not be arranged in a single array when intervals between the adjacent main bit lines are narrow. Therefore, the number of sense amplifiers arranged in parallel is determined by circuit configuration of sense amplifiers and size of memory cells, and sense amplifier arrays S/A(0)~S/A(k-1) may be embodied in a single array if necessary.

The wide page buffer unit 500 comprises sub data buses S_DB<0>~S_DB<k-1> corresponding one by one to sense amplifier arrays S/A(0)~S/A(k-1). That is, each sense amplifier array S/A(0)~S/A(k-1) is connected to the data buffer unit 900 through the corresponding sub data bus S_DB<0>~S_DB<k-1>.

Each sense amplifier array S/A(0)~S/A(k-1) comprises a plurality of unit sense amplifiers (not shown) corresponding one by one to main bit lines.

Figure 6:
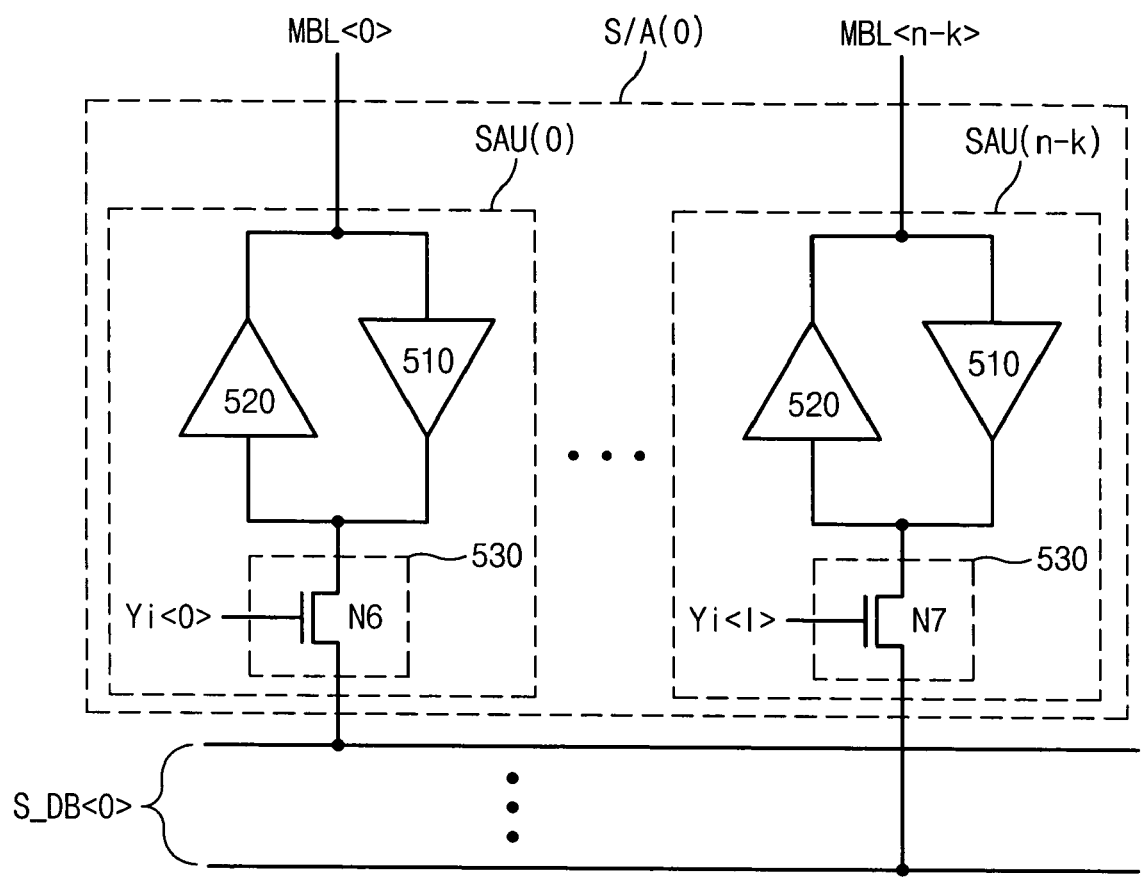
FIG. 6 is a diagram illustrating each unit sense amplifier included in a sense amplifier array.

FIG. 6 is a diagram illustrating each unit sense amplifier included in a sense amplifier array.

In FIG. 6, only the sense amplifier array S/A(0) is shown because each sense amplifier array S/A(0)~S/A(k-1) has the same configuration and function.

The sense amplifier array S/A(0) comprises a plurality of unit sense amplifiers SAU(0), . . . , SAU(n-k). Each unit sense amplifier SAU(0), . . . , SAU(n-k) comprises a sense amplifier unit 510, a write driving unit 520 and a switching unit 530.

In the read mode, the sense amplifier unit 510 senses sensing voltages of the main bit lines MBL<0> and MBL<n-k>, and outputs the read data to the switching unit 530.

In the write mode, the write driving unit 520 drives write data applied through the switching unit 530, and outputs the data to the main bit lines MBL<0> and MBL<n-k>.

An input terminal of the sense amplifier unit 510 and an output terminal of the write driving unit 520 are connected in common to the main bit lines MBL<0> and MBL<n-k>. An output terminal of the sense amplifier unit 510 and an input terminal of the write driving unit 520 are connected in common to the switching unit 530.

The switching unit 530 are turned on/off in response to the column selecting signals Y<0> and Y<1>, and selectively connects the output terminal of the sense amplifier unit 510 and the input terminal of the write driving unit 520 which are connected in common to the sub data bus S_DB<0>. The switching unit 530 comprises NMOS transistors N6 and N7 connected between the sub data bus S_DB<0>, and the common terminal which is connected to the output terminal of the sense amplifier unit 510 and the input terminal of the write driving unit 520. The NMOS transistor N6 has a gate to receive the column selecting signal Y<0>, and the NMOS transistor N7 has a gate to receive the column selecting signal Y<1>.

Figure 7:
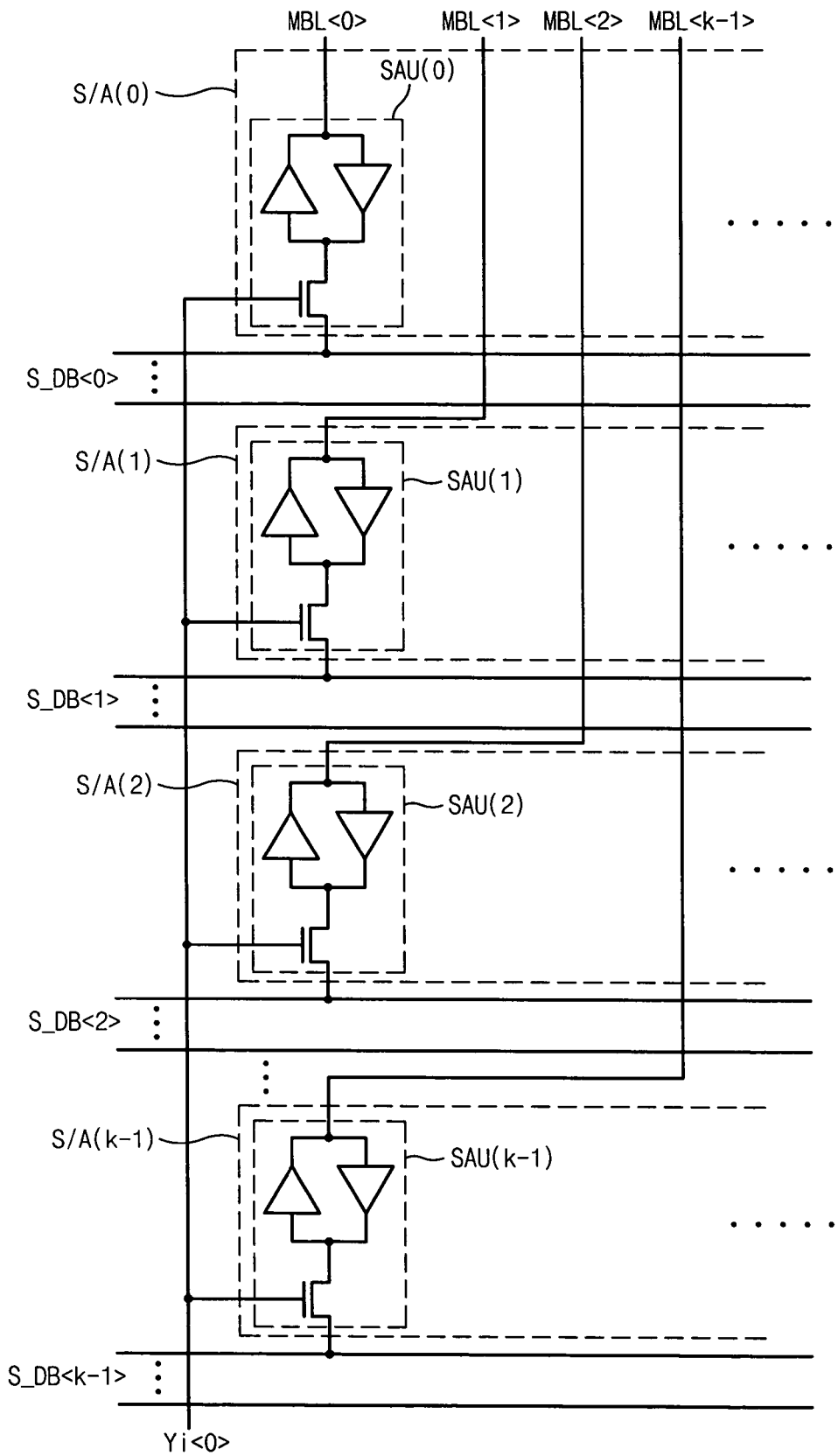
FIG. 7 is a circuit diagram illustrating a wide page buffer unit and the connection relationship of main bit lines and sub data buses.

FIG. 7 is a circuit diagram illustrating the connection relationship of the wide page buffer unit the main bit lines and the sub data buses.

The wide page buffer unit 500 comprises a plurality of sub data buses S_DB<0>~S_DN<k-1> corresponding one by one to the sense amplifier arrays S/A(0)~S/A(k-1) arranged in parallel. Here, each sub data bus S_DB(0)~S_DB(k-1) comprises the number of data bus lines which corresponds to a value obtained by dividing number of main bit lines(n) by that of sense amplifier arrays(k).

Each of the sub data buses S_DB<0>~S_DB<k-1> comprises a plurality of bus lines corresponding one by one to unit sense amplifiers SAU included in the corresponding sense amplifier array S/A(0)~S/A(k-1). Each sub data bus S_DB<0>~S_DB<k-1> is connected in parallel to the data buffer unit 900. As a result, the data buffer unit 900 is connected to n bus lines corresponding to the number of the whole main bit lines MBL<0>~MBL<n-1>.

The unit sense amplifiers located at the same sequence in each sense amplifier array S/A(0)~S/A(k-1) receive the same column selecting signal. That is, in each sense amplifier array S/A(0)~S/A(k-1), the first unit sense amplifiers SAU(0)~SAU(k-1) receive the column selecting signal Yi<0>, and the second unit sense amplifiers SAU(k)~SAU(2k-1) receive the column selecting signal Yi<1>.

As a result, in FIG. 7, data having successive k bits are transmitted to the data buffer unit 900 through the sub data buses S_DB<0>~S_DB<k-1> when one column selecting signal is activated. Here, the data width can be regulated.

Figure 8:
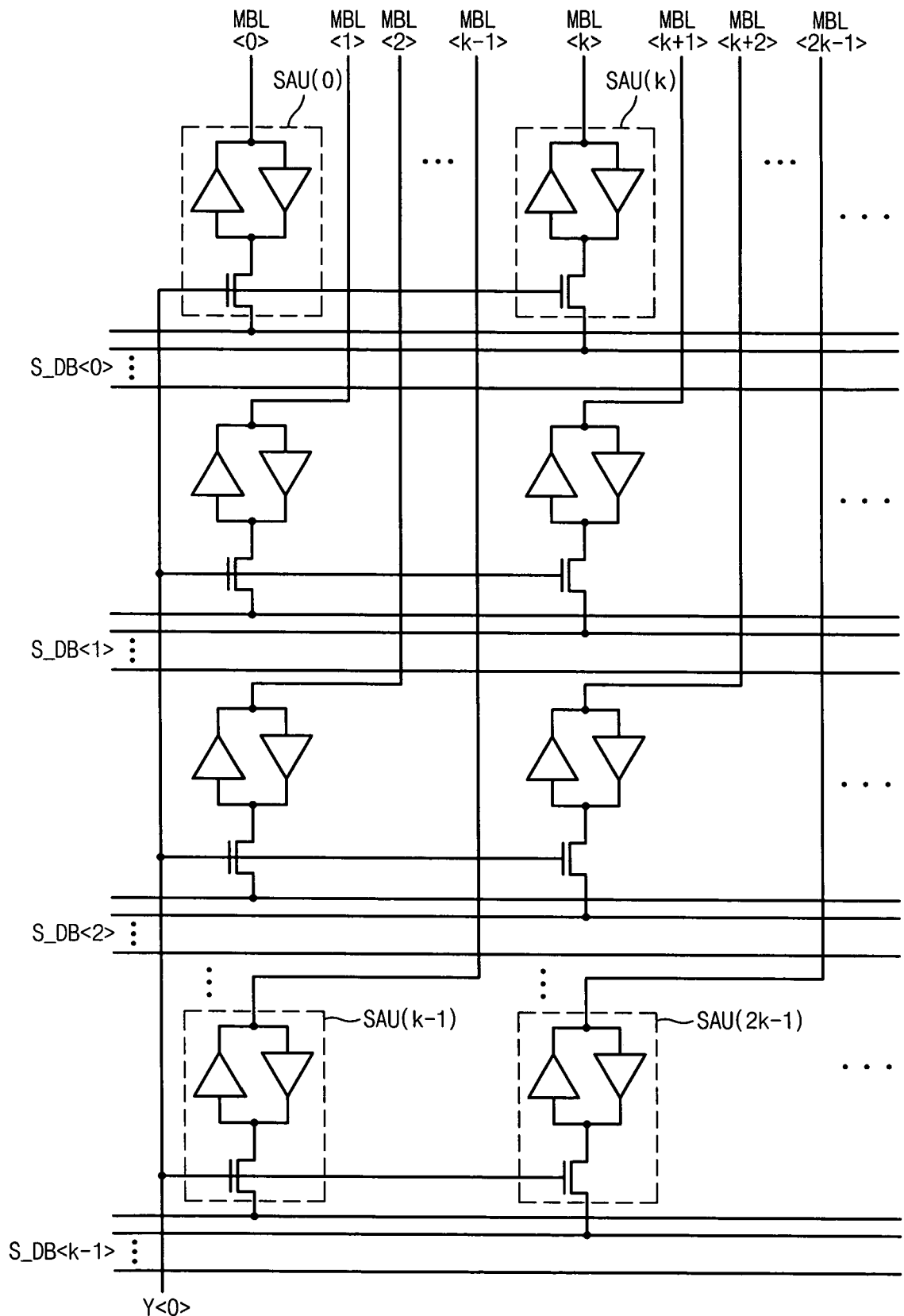
FIG. 8 is a circuit diagram illustrating another example of FIG. 7.

FIG. 8 is a circuit diagram illustrating another example of FIG. 7.

In FIG. 8, the second unit sense amplifiers SAU(0)~SAU(k-1) as well as the first unit sense amplifiers SAU(k)~SAU(2k-1) receive the same column selecting signal Yi<0>.

When one column selecting signal is activated, data of 2 k bits are simultaneously transmitted to the data buffer unit 900 in FIG. 8.

In this way, the read/write data width can be regulated as 2k, 3k, . . . , etc. by regulating the number of unit sense amplifiers receiving the same column selecting signal in each sense amplifier array S/A(0)~S/A(k-1).

Figure 9:
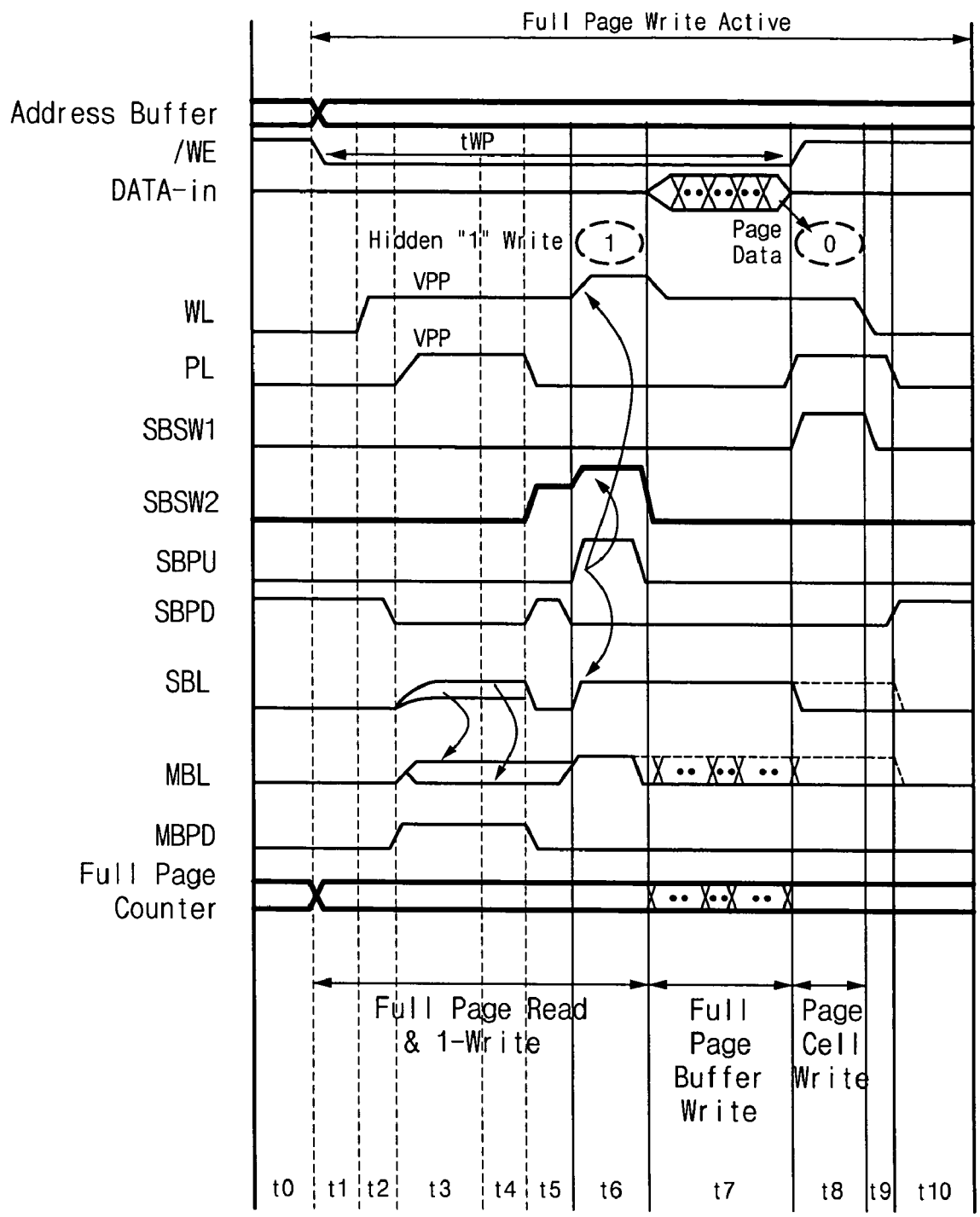
FIG. 9 is a timing diagram illustrating the write operation of the nonvolatile ferroelectric memory device according to an embodiment of the present invention.

FIG. 9 is a timing diagram illustrating the write operation of the nonvolatile ferroelectric memory device according to an embodiment of the present invention.

During intervals t0 and t1, the main bit lines MBL<0>~MBL<n-1> and the sub data buses S_DB<0>~S_DB<k-1> are pulled down before word lines and plate lines are activated.

When the interval t1 starts, if a write enable signal /WE is inactivated to 'low', the write mode becomes active. Then, if the column address is applied to the column address buffer unit 800, the full page counter 700 is activated.

In an interval t2, a word line WL is activated, and a sub bit line pull-down signal SBPD is maintained at an active sate. As a result, a storage node of a cell is initialized to a ground level.

After initialization, the sub bit line pull-down signal SBPD is inactivated to 'low', a plate line PL is activated to 'high'. Here, since the word line WL is activated earlier than the plate line PL for a predetermined time to stabilize the state of the cell storage node at the initial operation, thereby improving the sensing margin.

During intervals t3 and t4, data are sensed. In the interval t3, the plate line PL is activated to a pumping voltage VPP level, and cell data are transmitted to the sub bit line SBL. As a result, the voltage level of the sub bit line SBL rises. The NMOS transistor N2 is turned on by the sensing voltage transmitted to the sub bit line SBL, and the sensing voltage of the main bit line MBL is induced. Here, since the amount of current flowing through the NMOS transistor N2 is differentiated depending on the voltage level of the sub bit line SBL, the sensing voltage level of the main bit line MBL is also differentiated depending on cell data.

Thereafter, when an interval t5, the plate line PL is disabled to 'low', and a sub bit line selecting signal SBSW2 is enabled to 'high'. Then, the voltage level of the sub bit line SBL is downed to 'low'.

In an interval t6, if a high voltage is applied as a sub bit line pull-up signal SBPU and the sub bit line selecting signal SBSW2 is pumped, the high voltage is transmitted to the sub bit line SBL. If the word line WL is pumped, high data (hidden "1") are written in all cells connected to the pumped word line WL.

In an interval t7, data are transmitted to the wide page buffer unit 500 through the sub data buses S_DB<0>~S_DB<k-1>, and the data of the wide page buffer unit 500 are transmitted to the main bit line MBL. However, since a sub bit line selecting signal SBSW1 is kept off during the interval t7, the data of the main bit line MBL are not transmitted to the sub bit line SBL. As a result, the data transmitted to the main bit line MBL are not written to the cells.

If new data are written or updated in all unit sense amplifiers SAU of the wide page buffer unit 500, the plate line PL and the sub bit line selecting signal SBSW1 are transited to 'high' in an interval t8. As a result, the buffered data of n bits in the wide page buffer unit 500 are simultaneously transmitted to the sub bit line SBL through the whole main bit lines MBL, and written in the cell. Here, if the data of the sub bit line SBL are 'high', the data (hidden "1") written in the interval t6 are maintained. However, if the data of the sub bit line SBL are 'low', low data are written in the corresponding cell.

Figure 1:
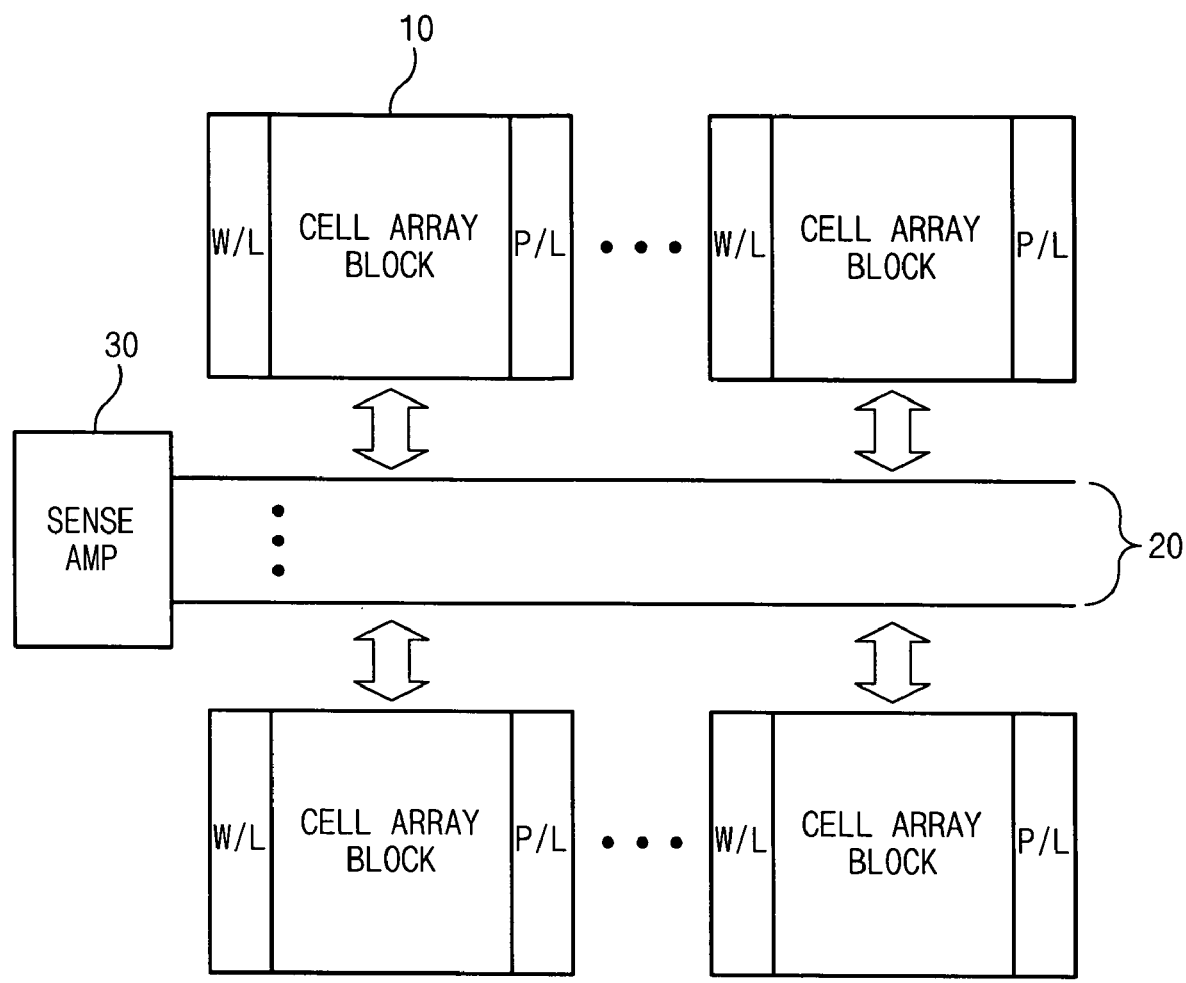
FIG. 1 is a diagram illustrating a conventional nonvolatile ferroelectric memory device.

In an embodiment, if write data are applied in a predetermined data width, data are buffered in the wide page buffer unit 500 until the data corresponding to the number of all main bit lines are all applied, and the buffered data are simultaneously written in the cells. However, according to the conventional art, data are accessed to the cell array block 10 whenever data applied in a predetermined data width, and then written as shown in FIG. 1.

In an interval t9, the word line WL, the plate line PL and the sub bit line selecting signal SBSW1 are disabled. Then, the sub bit line pull-down signal SBPD is enabled.

Figure 10:
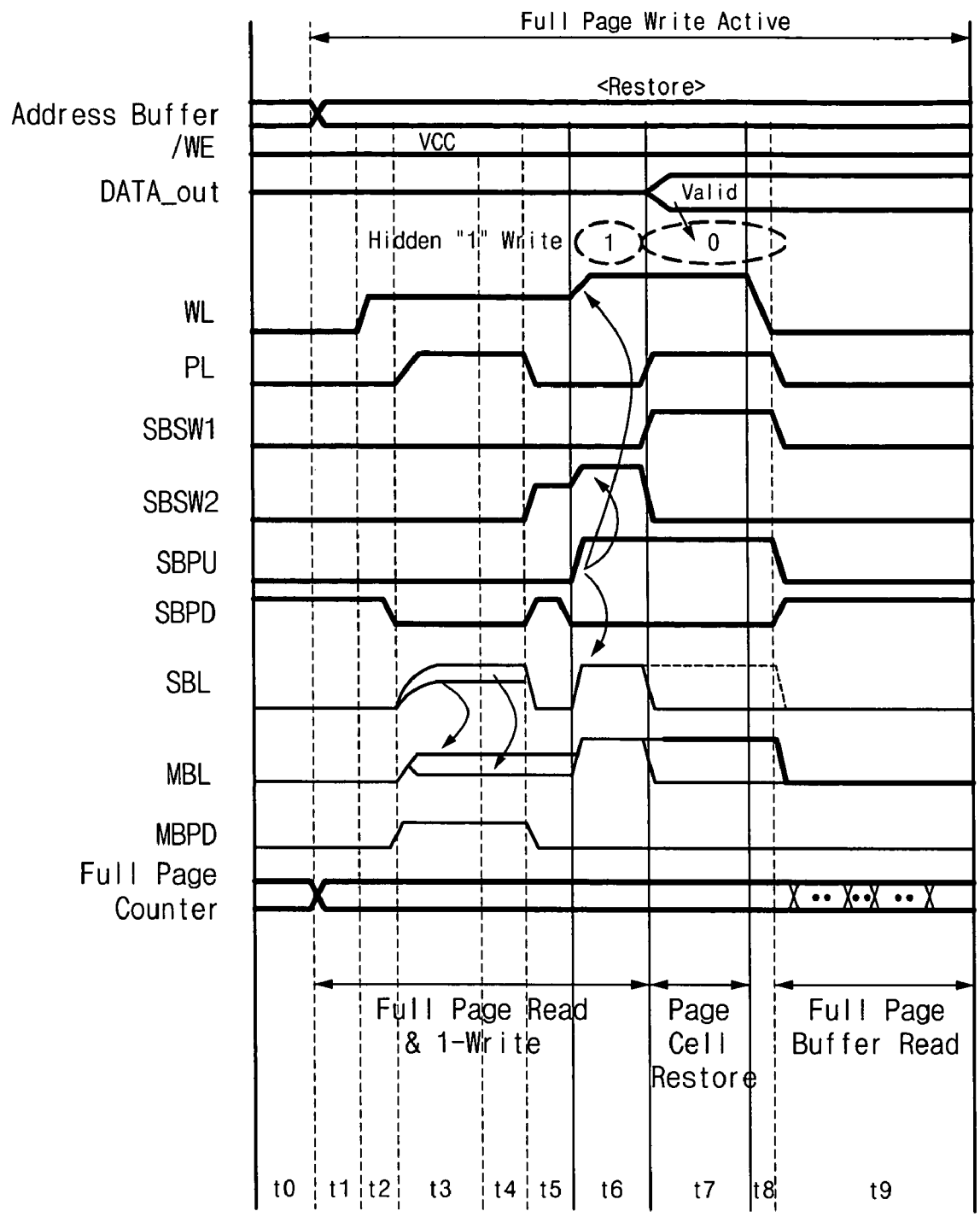
FIG. 10 is a timing diagram illustrating the read operation of the nonvolatile ferroelectric memory device according to an embodiment of the present invention.

FIG. 10 is a timing diagram illustrating the read operation of the nonvolatile ferroelectric memory device according to an embodiment of the present invention.

In the read mode, the write enable signal /WE is maintained at the power voltage VCC level.

Intervals t3 and t4 are data sensing periods.

In the interval t3, if the plate line PL is activated, cell data corresponding to the activated word line WL and the plate line PL are transmitted to the corresponding sub bit line SBL. The sensing voltage of the main bit line is induced in response to the voltage level of the sub bit line SBL. Each of the unit sense amplifiers SAU corresponding one by one to the main bit lines senses the sensing voltage of the corresponding main bit line, and buffers the sensed cell data.

After data buffering operation, in an interval t6, if a high voltage is applied as the sub bit line pull-up signal SBPU and the sub bit line selecting signal SBSW2 is pumped, the high voltage is transmitted to the sub bit line SBL. Then, if the word line WL is pumped, high data (hidden data "1") are written in all cells connected to the pumped word line WL.

In an interval t7, the read data are restored. In the interval t7, if the plate line PL is transited to 'high' and the bit line selecting signal SBSW1 is transited to 'high', data of the main bit line MBL are transmitted to the sub bit line SBL, and restored in the cell. Here, if data of the sub bit line SBL are 'high', the data (hidden "1") written in the interval t6 are maintained. However, if data of the sub bit line SBL are 'low', low data are written in the corresponding cell.

According to the conventional art, since the cell array block 10 is connected to the common data bus 20, read data are applied to the common data bus 20 and then restored. However, in an embodiment of the present invention, since data are previously stored in the wide page buffer unit 500, data can be restored even though the data are not applied to the data bus S_DB.

In an interval t9, data buffered in the wide page buffer unit 500 are read. In the interval t9, after the word line WL and the plate line PL are inactivated to 'low', data are sequentially outputted in response to the column selecting signals Yi<0>~Yi<1>.

At the initial state of the data read or write operation, the sensing and buffering or writing operation requires much time. However, after the data are buffered, the processing of the buffered data is faster than that of data through direct access to cell. As a result, the whole data processing time is remarkably reduced in the processing of data of high capacity.

As discussed earlier, in a nonvolatile ferroelectric memory device according to an embodiment of the present invention comprises a single cell array block including all cell arrays in the memory device and a page buffer of high capacity for simultaneously sensing and buffering data of all main bit lines. Accordingly the efficiency of cells is increased and the processing speed of data is improved.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device having a wide page buffering function, comprising:
   a single cell array block including all cell arrays having a hierarchical bit line architecture for inducing a sensing voltage of a main bit line depending on a sensing voltage of cell data transmitted to a sub bit line;
   a word line driving unit located at a first side of the single cell array block and for selectively activating a word line of the single cell array block;
   a plate line driving unit located at a second side of the single cell array block and for selectively activating a plate line of the single cell array block;
   a wide page buffer unit for simultaneously sensing voltages of all main bit lines in the single cell array block, buffering the sensed data and transmitting the buffered data to a data buffer unit by a predetermined data width in response to a column selecting signal; and
   a column selecting unit for selectively activating the column selecting signal in response to a column address.

2. The device according to claim 1, wherein the wide page buffer unit comprises:
a plurality of unit sense amplifiers, corresponding one by one to the main bit lines, for sensing and buffering a voltage of the corresponding main bit line and then outputting the buffered data in response to the column selecting signal; and
a plurality of bus lines, corresponding one by one to the unit sense amplifiers and selectively connected to the unit sense amplifiers in response to the column selecting signal, for transmitting data outputted from the unit sense amplifier to the data buffer unit.

3. The device according to claim 2, wherein the plurality of unit sense amplifiers are divided into a plurality of sense amplifier arrays arranged in parallel by a predetermined number depending on sequence of the main bit lines, and
the plurality of bus lines are divided into a plurality of sub data buses corresponding one by one to the sense amplifier arrays, and each of the sub data buses comprises bus lines corresponding to the number of unit sense amplifiers in the corresponding sense amplifier array.

4. The device according to claim 3, wherein the unit sense amplifiers located at the same sequence in each sense amplifier array receive the same column selecting signal.

5. The device according to claim 3, wherein each unit sense amplifier comprises:
a sense amplifier for sensing and buffering a sensing voltage of the main bit line;
a write driving unit for driving data applied from the sub data bus and outputting the driven data to the main bit line; and
a switching unit for selectively connecting the sense amplifier and the write driving unit to the sub data bus in response to the column selecting signal.

6. The device according to claim 1, further comprising a page counter for counting the column address, controlling generation of the column selecting signal from the column selecting unit, and regulating widths of data outputted from the wide page buffer unit.

7. The device according to claim 6, wherein the wide page buffer unit comprises:
a plurality unit sense amplifiers, corresponding one by one to the main bit lines, for sensing and buffering the voltage of the corresponding main bit line and then outputting the buffered data in response to the column selecting signal; and
a plurality of bus lines, corresponding to one by one to the unit sense amplifiers and selectively connected to the unit sense amplifiers, for transmitting data outputted from the unit sense amplifier to the data buffer unit.

8. The device according to claim 7, wherein the plurality of unit sense amplifiers are divided into a plurality of sense amplifier arrays arranged in parallel by a predetermined number depending on sequence of the main bit line, and
the plurality of bus lines are divided into a plurality of sub data buses corresponding one by one to the sense amplifier arrays, and each of the sub data buses comprises bus lines corresponding to the number of unit sense amplifiers in the corresponding sense amplifier array.

9. The device according to claim 8, wherein the unit sense amplifiers located at the same sequence in each sense amplifier array receive the same column selecting signal.

10. The device according to claim 8, wherein each of unit sense amplifiers comprises:
a sense amplifier for sensing and buffering a sensing voltage of the main bit line;
a write driving unit for driving data applied from the sub data bus and outputting the driven data to the main bit line; and
a switching unit for selectively connecting the sense amplifier and the write driving unit to the sub data bus in response to the column selecting signal.

11. The device according to claim 1, wherein the wide page buffer unit buffers write data applied from the data buffer unit in the predetermined data width until write data corresponding to all the main bit lines are applied.

12. The device according to claim 11, wherein wide page buffer unit comprises:
a plurality unit sense amplifiers, corresponding one by one to the main bit lines, for sensing and buffering the voltage of the corresponding main bit line and then outputting the buffered data in response to the column selecting signal; and
a plurality of bus lines, corresponding to one by one to the unit sense amplifiers and selectively connected to the unit sense amplifiers, for transmitting data outputted from the unit sense amplifier to the data buffer unit.

13. The device according to claim 12, wherein the plurality of unit sense amplifiers are divided into a plurality of sense amplifier arrays arranged in parallel by a predetermined number depending on sequence of the main bit line, and
the plurality of bus lines are divided into a plurality of sub data buses corresponding one by one to the sense amplifier arrays, and each of the sub data buses comprises bus lines corresponding to the number of unit sense amplifiers in the corresponding sense amplifier array.

14. The device according to claim 13, wherein the unit sense amplifiers located at the same sequence in each sense amplifier array receive the same column selecting signal.

15. The device according to claim 13, wherein each of the unit sense amplifiers comprises:
a sense amplifier for sensing and buffering a sensing voltage of the main bit line;
a write driving unit for driving data applied from the sub data bus and outputting the driven data to the main bit line; and
a switching unit for selectively connecting the sense amplifier and the write driving unit to the sub data bus in response to the column selecting signal.

* * * * *